(12) United States Patent
Tabrizian et al.

(10) Patent No.: US 10,985,741 B2
(45) Date of Patent: Apr. 20, 2021

(54) PHONONIC FREQUENCY SYNTHESIZER

(71) Applicant: University of Florida Research Foundation, Incorporated, Gainesville, FL (US)

(72) Inventors: Roozbeh Tabrizian, Gainesville, FL (US); Mayur Ghatge, Gainesville, FL (US)

(73) Assignee: UNIVERSITY OF FLORIDA RESEARCH FOUNDATION, INCORPORATED, Gainesville, FL (US)

( * ) Notice: Subject to any disclaimer, the term of this patent is extended or adjusted under 35 U.S.C. 154(b) by 0 days.

(21) Appl. No.: 16/408,142

(22) Filed: May 9, 2019

(65) Prior Publication Data
US 2020/0336136 A1 Oct. 22, 2020

Related U.S. Application Data

(60) Provisional application No. 62/673,741, filed on May 18, 2018.

(51) Int. Cl.
| | |
|---|---|
| *H01P 3/12* | (2006.01) |
| *H03K 5/01* | (2006.01) |
| *H01L 41/187* | (2006.01) |

(52) U.S. Cl.
CPC .............. *H03K 5/01* (2013.01); *H01L 41/187* (2013.01); *H01P 3/12* (2013.01)

(58) Field of Classification Search
CPC ........... H03K 5/01; H01L 41/187; H01P 3/12; H01P 3/121; H01P 3/10
See application file for complete search history.

(56) References Cited

U.S. PATENT DOCUMENTS 7,939,990 B2 * 5/2011 Wang ................... H03H 9/2452
310/320

OTHER PUBLICATIONS

McCall, K.R. *Theoretical Study of Nonlinear Elastic Wave Propagation*, Journal of Geophysical Research: Solid Earth, vol. 99, No. B2, Feb. 10, 1994, pp. 2591-2600.

* cited by examiner

*Primary Examiner* — Jung Kim
(74) *Attorney, Agent, or Firm* — Alston & Bird LLP

(57) ABSTRACT

The structure of a frequency synthesizer for acoustic waves includes an input narrow band transducer in its input arm for receiving an input electric signal at an input frequency, a wide band transducer in its output arm for supplying an output signal; and a perforated region formed of a two dimensional array of cavities disposed between the first and second arms. The first arm contains multiple metal fingers, disposed perpendicular to the first arm and spaced apart from one another at a distance of the wavelength of the input signal to ensure acoustic excitation in the first arm at the input frequency. The second arm contains a single finger to accommodate a non-linear output signal oscillating at a harmonic of the first frequency. The frequency synthesizer can be patterned in aluminum nitride (AlN) in a silicon substrate.

20 Claims, 7 Drawing Sheets

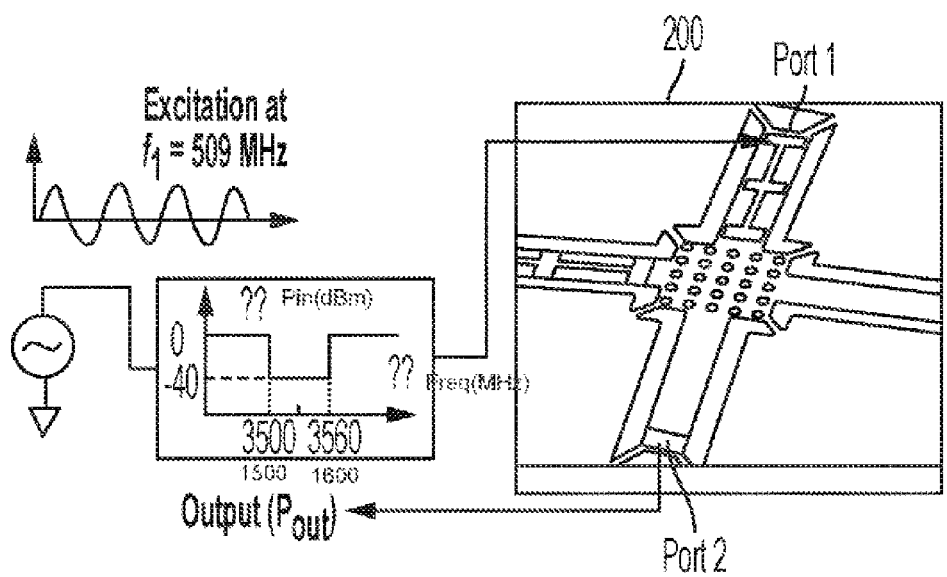
FIG. 6A
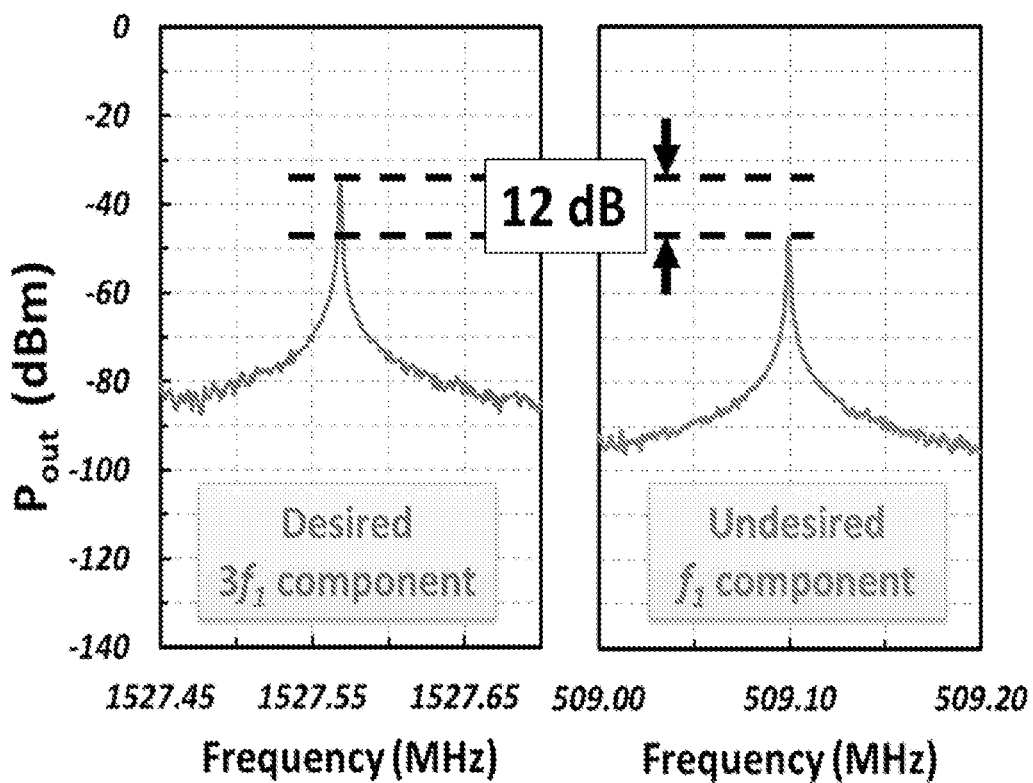
FIG. 6B1
FIG. 6B2

PHONONIC FREQUENCY SYNTHESIZER

CROSS REFERENCE TO RELATED APPLICATION

The present invention claims the benefits of priority to provisional patent application No. 62/673,741, filed on May 18, 2018, entitled "Phononic Frequency Synthesizer", the contents of which are incorporated herein by reference in its entirety.

FIELD OF THE INVENTION

The present invention relates to a frequency synthesizer, and more particularly to a multi-band, phase-synchronous phononic frequency synthesizer.

BACKGROUND OF THE INVENTION

The increasing demand for higher communication data rates together with the rise in the number of wireless users calls for substantial enhancement of wireless communication architectures and hardware. To accommodate the required capacity, emerging wireless systems target system-level transformation to exploit multi-band communication schemes over ultra-wide spectrums, extended over ultra and super high-frequency regimes (i.e. UHF: 0.3-3 GHz and SHF: 3-30 GHz). Such a transformation enables a boost in the spectrum resources through accessing white bands in cm and mm wave spectrum. Multi-band communication systems rely on spread-spectrum communication schemes that distribute wide-band signals among several distinct carrier frequencies (i.e. carrier aggregation) and over an extended spectrum to accommodate enhanced communication data rates. Realization of spread-spectrum wide-band communication systems requires a phase-synchronous set of frequency references to serve as local oscillators at each carrier frequency and thereby facilitates coherent combination of data from multiple carriers without signal distortion.

Such a reference set is currently realized through several standalone resonators and phase locked loop (PLL) based synthesizers that impose additional burden on the integration, complexity, and power consumption of the systems. Furthermore, with the inevitable increase in the number of constituent sub-carriers and extension of communication bands into higher frequencies, beyond the UHF, the significant degradation in the phase-noise and increased output-to-input frequency ratios of PLL-based synthesizers renders them inefficient at such frequencies.

SUMMARY

The disclosure provides a waveguide which includes a first arm for receiving an input electric signal, a second arm for supplying an output signal, and a perforated region comprising a plurality of cavities disposed between the first and second arms, according to one embodiment.

Another embodiment of the disclosure provides a waveguide which includes a first arm for receiving an input electric signal at a first frequency, a second arm for supplying an output signal; and a perforated region comprising a plurality of cavities disposed between the first and second arms. The first arm comprises a plurality of metal fingers, disposed perpendicular to the first arm and spaced apart from one another by a wavelength of the input electric signal to ensure acoustic excitation in the first arm at the first frequency. The second arm comprises a single finger to accommodate a non-linear output signal having a frequency at a harmonic of the first frequency.

According to the embodiments, the output signal further comprises a linear output signal at the first frequency, wherein the linear output signal is characterized as degrading with higher frequencies and the non-linear output signal is characterized as increasing intensity with higher frequencies.

Optionally, the non-linear output signal resonates at a third harmonic of the first frequency.

Optionally, the perforated region comprises a two dimensional array of cavities for filtering acoustic waves of the first frequency.

Preferably, the frequency synthesizer is formed from aluminum nitride (AlN) on a semiconductor substrate.

According to another embodiment of the disclosure, the waveguide further comprises a third and a fourth arms coupled to the first and second arms by the perforated region, where the first, second, third and fourth arms form a cross-coupled rectangular waveguide.

BRIEF DESCRIPTION OF DRAWINGS

FIG. 6A shows an experimental set up for characterization of the transducer matrix.

FIGS. 6B1 and 6B2 illustrate the measured dynamic spectral data from the set up in FIG. 6A.

DETAILED DESCRIPTION OF THE INVENTION

Figure 1A:
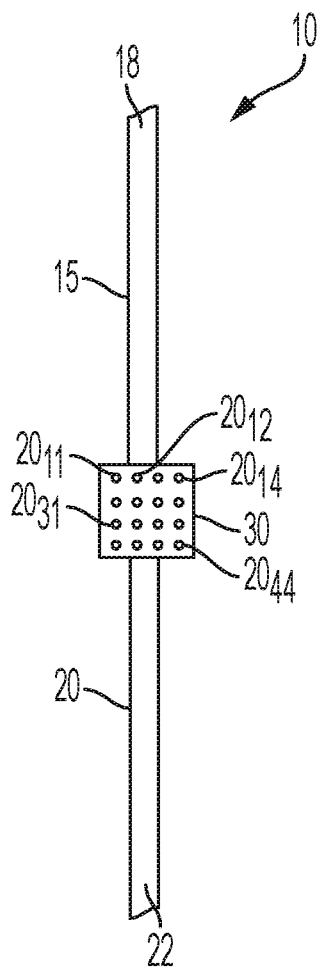
FIG. 1A is a schematic high-level block diagram of a transducer matrix of waveguide arms, in accordance with one exemplary embodiment of the present invention.

In order to clarify the purpose, technical solution details, and advantages of the embodiments of the present disclosure, the embodiments of the present disclosure are clearly and completely described in the following with reference to the accompanying drawings in the embodiments of the present disclosure. Clearly, the described embodiments are merely exemplary embodiments of the present disclosure, therefore shall not be interpreted as limiting the present disclosure. All other embodiments obtained by those skilled in the art without creative efforts according to the embodiments of the present disclosure are within the scope of the present disclosure.

A greater understanding of the present invention and it many advantages may be had from the following description, accompanied by illustrations. The following descriptions show embodiments and variants of the devices in the present invention, and their applications and fabrication method. They are, of course, not to be considered as limiting the invention. Numerous changes and modifications is made with respect to the invention. A greater understanding of the present invention and it many advantages may be had from the following description, accompanied by illustrations. The following descriptions show embodiments and variants of the devices in the present invention, and their applications and fabrication method. They are, of course, not to be considered as limiting the invention. Numerous changes and modifications is made with respect to the invention.

Embodiments of the present invention provide one or more phase-synchronous frequency synthesizers (generators) that are coupled through elastic anharmonicity. Elastic anharmonicity is an inherent property of solids stemming from nonlinear binding forces of atoms and molecules. Such anharmonicity results in acoustic wave-mixing processes and enables excitation of harmonic waves at any integer or non-integer multiple of a reference frequency in the mechanical domain. Such a mechanical synthesizer benefits from precise frequency multiplication ratios and is substantially immune to electromagnetic interference and frequency pulling effects that are common in their electronic counterparts.

The inter-atomic binding forces in solids are nonlinear and thus the elastic properties are anharmonic. Such anharmonicity can be expressed through the nonlinear Hooke's law as a relation between stress and strain tensors:

$$\sigma_{ij} = C_{ijkl}\varepsilon_{kl} + C_{ijklmn}\varepsilon_{kl}\varepsilon_{mn} + C_{oklmp}[\varepsilon_{kl}\varepsilon_{mn}\varepsilon_{op} + \quad (1)$$

In expression (1), parameters $\sigma_{ij}$ and $\varepsilon_{ij}$ represent stress and strain coefficients, and $C_{ijkl}$, $C_{ijklmn}$ are second, third and fourth order intrinsic material elastic constants. As is seen from (1), the elastic anharmonicity leads to nonlinear wave-mixing. Such mixing is studied in optics and photonics systems and benefits from Kerr anharmonicity in refractive index for realization of nonlinear and nonreciprocal signal processors. However, the exploration of elastic/phononic wave-mixing processes have been limited to the understanding of the nature of such processes and their significance in heat transport dynamics. The application of acoustic wave-mixing in micro and nano-electro-mechanical systems (M/NEMS) has gained significant attention and resulted in investigations on the anisotropic behavior of elastic anharmonicity in single crystal silicon as well as the first experimental demonstration of phononic combs.

In an infinite/unbounded and loss-less isotropic solid, the acoustic wave propagation dynamics in the presence of elastic anharmonicity can be expressed as:

$$\frac{1}{c^2}\ddot{u} = \frac{\partial}{\partial x}\left[\frac{\partial u}{\partial x} + \frac{E_1}{E_0}\left(\frac{\partial u}{\partial x}\right)^2 + \frac{E_2}{E_0}\left(\frac{\partial u}{\partial x}\right)^3\right] + u_{f_1}k_1^2\sin(2\pi f_1 t). \quad (2)$$

In equation (2), c represents the wave propagation velocity; u(x,t) represents the particle displacement; $E_0$, $E_1$, and $E_2$ represent the first, second and third order elastic moduli; $u_{f_1}$ is the source equivalent excitation amplitude at the origin (i.e. x=0); $f_1$ is the frequency of excitation and $K_1$ is the corresponding wave-number at $f_1$. The nonlinear equation (2) may be solved using Green function. The following assumptions are made in deriving the following expressions: i) infinite loss-less solid is considered (thus null dispersion and zero attenuation), and ii) wave propagating only in x-direction. Solving (2) for the single-frequency mechanical excitation at $f_1$ results in second and third harmonics at $2f_1$ and $3f_1$, with an inter-harmonic coupling efficiency depending on the excitation amplitude, distance from excitation source, and first, second and third-order elastic moduli:

$$u = \begin{cases} \left(u_{f_1} - \frac{u_{f_1}^3 k_1^3}{8}\left(\frac{4}{k_1}\left(\frac{E_1}{E_0}\right)^2 - \frac{3}{k_1}\frac{E_2}{E_0}\right)\right)\sin(2\pi f_1 t - k_0 x) + \\ \frac{u_{f_1}^3 k_1^3 x}{8}\left(4\left(\frac{E_1}{E_0}\right)^2 - 3\frac{E_2}{E_0}\right)\cos(2\pi f_1 t - k_1 x) - \\ \frac{E_1}{E_0}\frac{u_{f_1}^2 k_1^2 x}{4}[1 + \cos(2\pi(2f_1)t - 2k_1 x)] \\ \frac{u_{f_1}^3 k_1^2}{8}\left(\frac{1}{3k_1}\frac{E_2}{E_0} - \frac{4}{9k_1}\left(\frac{E_2}{E_0}\right)^2\right)\sin(2\pi(3f_1)t - 3k_1 x) + \\ \frac{u_{f_1}^3 k_1^2 x}{8}\left(\frac{4}{3}\left(\frac{E_1}{E_0}\right)^2 - \frac{E_2}{E_0}\right)\cos(2\pi(3f_1)t - 3k_1 x) \end{cases} \quad (3)$$

In expression (3) $u_{f_2}$ represents the vibration amplitude at $f_1$, $K_1$ represents the wave-number of the linearly excited component at $f_1$, and x is the distance from the excitation source. As is seen from (3), elastic anharmonicity facilitates excitation of harmonics at higher frequencies which are naturally phase-synchronous to the excitation source.

In accordance with one exemplary embodiment of the present invention, elastic anharmonicity is used to generate harmonics or any non-integer multiple of the excitations signal in a waveguide with a near-field inter-modal transduction efficiency, and as defined by the following expression:

$$\frac{u_{3f_1}}{u_{f_1}} = \frac{u_{f_2}^2 k_1^3}{8}\left(\frac{1}{3}\frac{E_3}{E_0} - \frac{4}{9}\left(\frac{E_1}{E_0}\right)^2\right) = \frac{n^2 u_{f_1}^2 k_1^2}{2c^2}\left(\frac{1}{3}\frac{E_2}{E_2} - \frac{4}{9}\left(\frac{E_1}{E_0}\right)^2\right). \quad (4)$$

In one embodiment, the waveguide is formed from AlN, and the $3^{rd}$ harmonic of the excitation signal is generated. As is seen from expression (4), considering a similar excitation amplitude (i.e. $u_{f_1}$), the inter-modal transduction efficiency increases with the excitation frequency. Embodiments of the present invention form a mechanical frequency synthesizer, using the above effects, for multi-band wireless systems in cm and mm wave spectrums. As is known, linear acoustic signal processors fail to achieve such frequency synthesis due to their degradation in efficient electromechanical transduction.

Sustaining a constant excitation amplitude independent of the excitation frequency may be challenging in practice since at higher frequencies and lower wavelengths, the vibration amplitude may exceed the elastoplastic yield point and result in irreversible deformation of solid. Furthermore, in piezoelectric waveguides, achieving a similar vibration amplitude at higher frequencies requires a larger number of miniaturized transducer fingers, which may further enhance extrinsic energy dissipation due to increased surface to volume ratio and corresponding surficial loss mechanisms.

Referring to expression (4), highly-efficient inter-harmonic energy transfer is feasible through large-signal excitation as well as proper design of the elastic anharmonicity function shown below:

$$F(E_{i=0,1,2}) = \left[\frac{1}{3}\frac{E_2}{E_0} - \frac{4}{9}\left(\frac{E_1}{E_0}\right)^2\right].\quad(5)$$

The following description of the exemplary embodiments of the present invention are provided with reference to a phase-synchronous phononic frequency synthesizer (alternatively referred to hereinafter as local oscillator) formed using aluminum nitride (AlN). It is understood, however, that the use of AlN is exemplary and many other materials may be used. For example, when a semiconductor material is used to form a frequency synthesizer, parameters such as doping profile, as well as physical characteristics of the material, such as the crystal orientation of the semiconductor material, are used to further enhance the properties and performance of the frequency synthesizer.

When an AlN film is used to form a frequency synthesizer, in accordance with one exemplary embodiment of the present invention, the elastic anharmonicity function $F(E_{i=0,1,2})$ of the frequency synthesizer is selected so as to closely relate to the amplitude-frequency coefficient of its vibration modes. In one example, an AlN layer having a thickness of 1.5 μm is used to form the waveguide arms that are separated from one another by an area defined by a multitude of one or two-dimensional cavities; such an area is alternatively referred to herein as the perforated region. The waveguide arms and the perforated region disposed therebetween—which together form a phase-synchronous photonic frequency synthesizer—are alternatively referred to herein as a matrix.

FIG. 1A is a simplified high-level block diagram of a matrix of waveguide arms, in accordance with one exemplary embodiment of the present invention. Matrix 10 of waveguide arms is shown as including, in part, a first waveguide arm 15, a second arm waveguide 20, and a perforated region 30 (alternatively referred to herein as perforated plate). Input port 18 of waveguide arm 15 may be used to supply an electromagnetic signal to the matrix, the signal will be converted to acoustic oscillation signal by synthesizer 10, and output port 22 of waveguide arm 20 may be used to supply the output oscillating signal. Perforated region 30 is shown as including a two dimensional 4×4 array of sixteen cavities $20_{ij}$ where i and j refer to the row and column index number in which the cavity is disposed. For example, cavity $20_{11}$ is shown as being disposed in row 1 and column 1. Likewise, cavity $20_{44}$ is shown as being disposed in row 4 and column 4. Although matrix 10 is shown as including two waveguide arms, it is understood that a matrix, in accordance with embodiments of the present invention may have any number of waveguide arms, such as 4. Furthermore, although matrix 10 is shown as including sixteen cavities disposed along x-y dimensions, it is understood that other embodiments of a matrix, in accordance with the embodiment of present invention, may have more or fewer than sixteen arranged along a one, two or three dimensions. Furthermore, although the following description is made with reference to a matrix of waveguide arms formed using aluminum nitride (AlN), it is understood that other embodiments of a matrix of waveguide arms, in accordance with embodiments of the present invention, may be formed using semiconductors or other materials.

Matrix 10 is adapted to generate, using nonlinear wave-mixing, an electrically isolated phase-synchronous signal at its output port 22 whose frequency $f_2$ is a multiple (integer or non-integer) or a fraction of the frequency $f_1$ of a reference signal applied to input port 18 of the matrix 10.

The perforated plate 30 is adapted to have a wide acoustic bandgap about frequency $f_1$ so as to trap the energy of signals having and near frequency $f_1$. The perforated plate 30, while isolating the matrix from resonant vibrations of individual waveguide constituents at frequency $f_1$, is designed to be transparent to a specific harmonic (e.g., $3f_1$) or non-harmonic multiple or fraction of frequency $f_1$. Therefore relatively large-signal excitation of frequency $f_1$ mode in a constituent waveguide, generates acoustic waves at, for example, $3f_1$ with an efficiency defined by the elastic anharmonicity of the matrix. The phase-synchronous propagation of, e.g., the third harmonic through the matrix, is amplified by a high quality-factor resonance mode at frequencies near or at $f_2$. A matrix, in accordance with embodiments of the present invention, thus enables the realization of frequency-multiplied and phase-synchronous, yet electrically isolated, reference signals for multi-band carriers and spread-spectrum wireless communication systems.

Figure 1B:
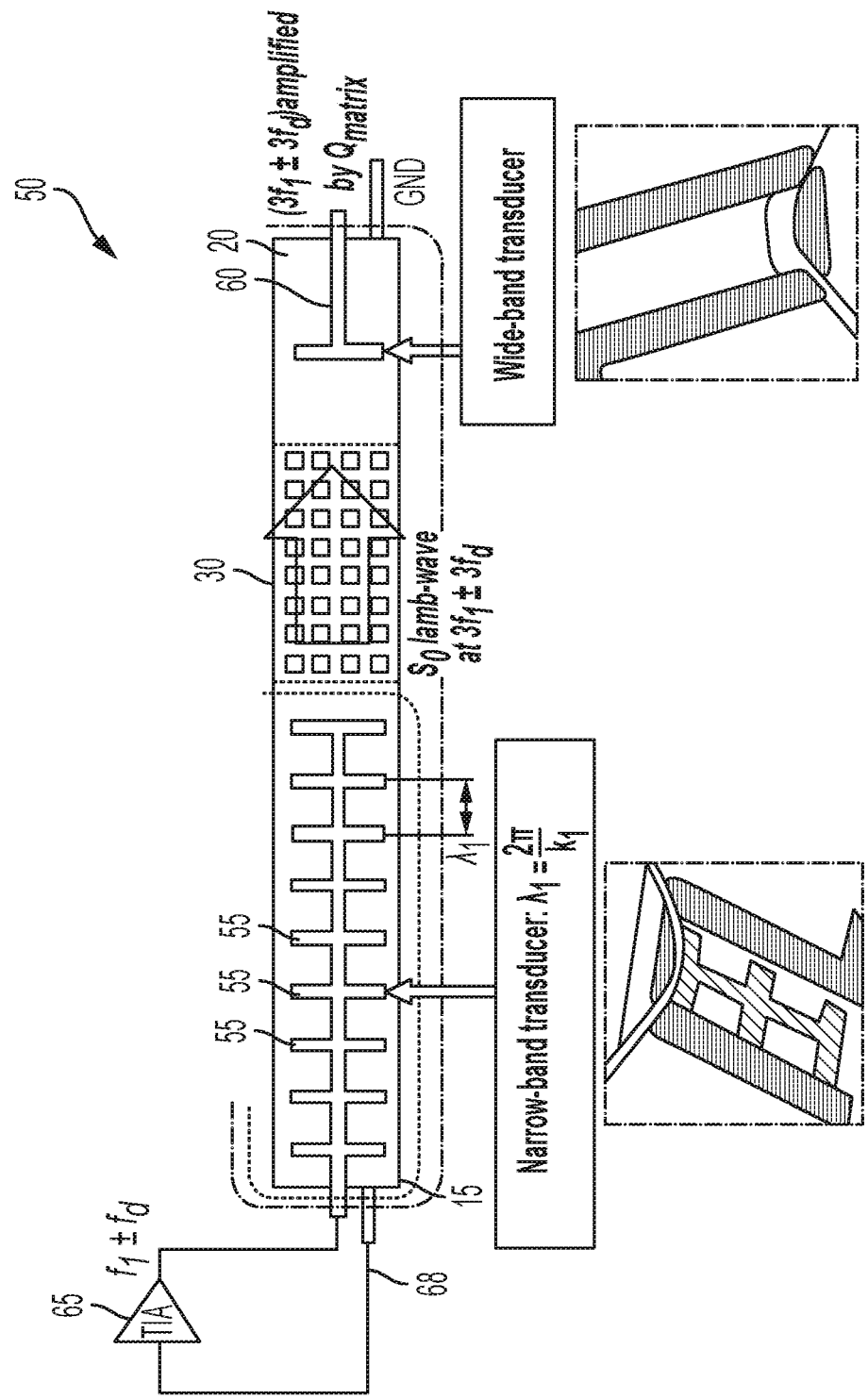
FIG. 1B is a schematic high-level block diagram of a transducer matrix, in accordance with another exemplary embodiment of the present invention.

FIG. 1B is a simplified high-level block diagram of a matrix 50, in accordance with another exemplary embodiment of the present invention, adapted to generate a $3^{rd}$ harmonic of input reference frequency $f_1$ received at input waveguide arm 15. Waveguide arm 15 forms a narrow-band transducer shown as including a multitude of metal fingers 55 spaced apart from one another by the wavelength $\lambda_1$ of signal $f_1$ to ensure excitation at $f_1$ while avoiding excitations at other frequencies. Output signal having the frequency of $3f_1$, in this embodiment, is received at output waveguide arm 20. Output waveguide arm 20 forms a wide-band transducer shown as including, e.g., only a single finger 60 to accommodate highly efficient sensing of the signal at $3f_1$ and avoid potential destructive effect of velocity dispersion at higher than $3f_1$ frequencies. Perforated region 30 couples input and output waveguide arms 15 and 20 to one another. Trans-impedance amplifier 65 (TIA) is the circuitry to enable close-loop excitation of oscillations at $f_1$ in input waveguide arm 15. The TIA may be an external circuitry connected to the electrodes 67 and 68 of the input waveguide 15 through wires, or directly integrated on the electrodes of waveguide 15 through proper monolithic integration process. Electrical oscillations at the transduction port and acoustic waves generated within the waveguide arm 15 at frequency $f_1$ (that may have a frequency drift±$f_d$) is generated by applying a DC voltage to TIA 65.

FIG. 1B also shows a different six fingered narrow band transducer in the input waveguide at the lower left side, and a single fingered wide-band transducer in the output waveguide at the lower right side.

Figure 2A:
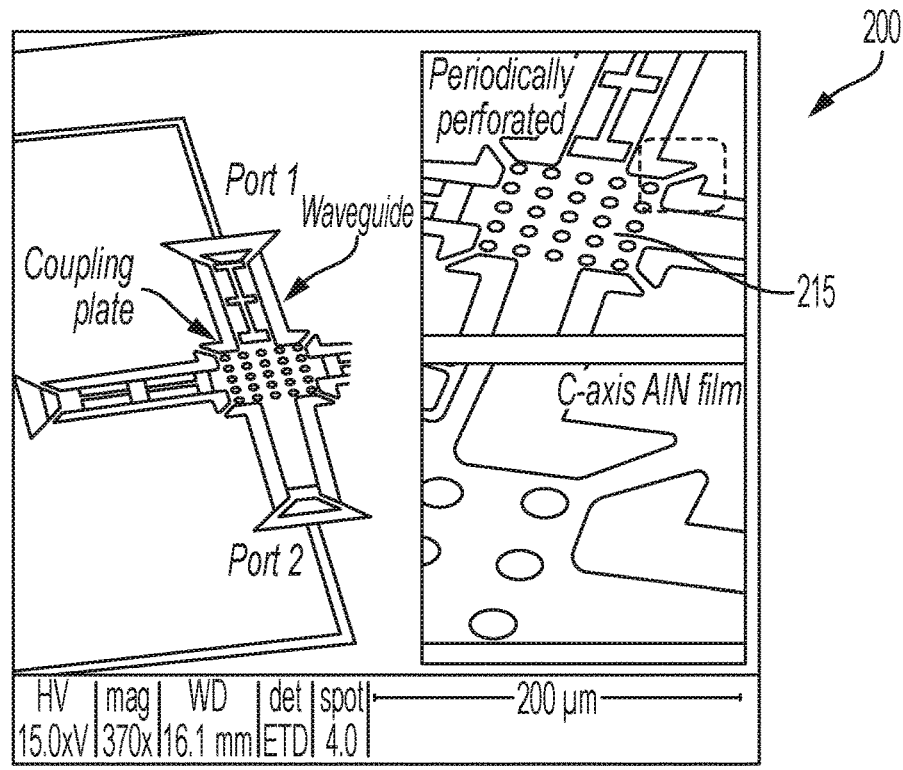
FIG. 2A shows an exemplary transducer matrix having four rectangular waveguide arms, according to an embodiment of the disclosure.

FIG. 2A shows an exemplary transducer matrix 200 having four rectangular waveguide arms that are cross-coupled through perforated region 215. The left diagram is a top overview of the four arm matrix 200. The diagram in the upper right shows the perforated region 215 of matrix 200 and the lower right diagram is the enlarged view of one corner of the perforated region 215.

Waveguide arms are built in a layer of semiconductor materials on a silicon substrate. Aluminum nitride has piezoelectric properties, which can be applied to convert the electric magnetic excitations into acoustic waves in an aluminum nitride film. Therefore, epitaxially grown thin film crystalline aluminum nitride is often used for surface acoustic wave sensors deposited on silicon wafers. They are, of course, not to be considered as limiting the invention.

In this exemplary embodiment, Molybdenum (Mo) electrodes are placed at port 1 to facilitate selective excitation of the S0 Lamb-wave referring to FIG. 1B. Mo electrodes at port 2 enable electrically and spectrally isolated sensing of the 3rd harmonic ($3f_1 \pm f_d$) that is generated through elastic anharmonicity of the AlN film including any frequency drift $f_d$.

Figure 2B:
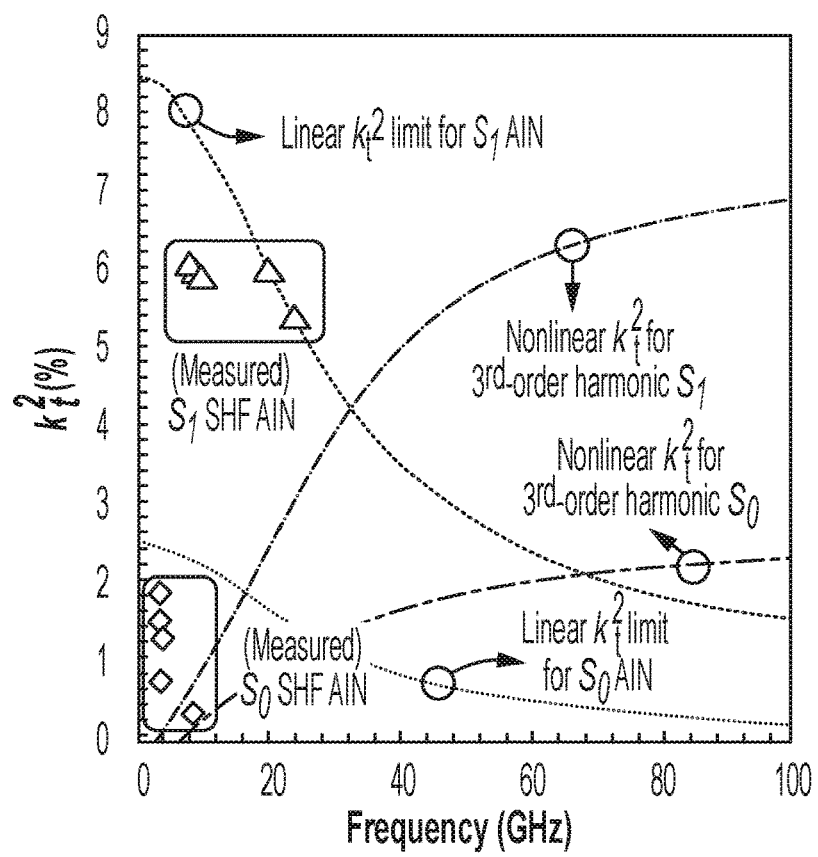
FIG. 2B shows a dynamic relationship of the electromechanical transducer coefficients versus frequencies.

FIG. 2B shows a dynamical relationship of the electromechanical transduction coefficients versus spectrum. In FIG. 2B, $K_t^2$ for 100 nm displacement amplitude at $f_1$ excitation is plotted over the 0.3-100 GHz spectrum range for in-plane ($S_0$) and out-of-plane ($S_1$) extensional modes. This graph shows an analytically extracted linear $K_{t,linear}^2$ and a nonlinear $K_{t,non-linear}^2$ coefficients at $3f_1$ harmonic which is excited from elastic anharmonicity. It is understood that $K_{t,linear}^2$ represents the fraction of the electrical energy that is converted to mechanical energy at the excitation frequency $f_1$, and $K_{t,non-linear}^2$ represents the fraction of the electrical energy that is converted to mechanical energy at the third harmonics $3f_1$ of the excitation frequency $f_1$.

The coupling coefficients may be defined as following:

$$k_t^2 = \frac{Mech.Energy}{Overall\ Energy\ Stored} \cong \frac{Mech.Energy\ stored\ at\ f_2}{Overall\ Energy\ Stored} + \frac{Mech.Energy\ stored\ at\ 3f_1}{Overall\ Energy\ Stored} = k_{t,liner}^2 + k_{t,nonlinear}^2. \quad (5)$$

The above-described characteristics are extracted for $S_0$ (i.e. in-plane extensional) and $S_1$ (i.e. out-of-plane extensional) Lamb waves, and are compared with measured $k_t^2$ of linear M/NEMS resonators operating based on such waves (i.e. $S_0$-based in-plane: lateral-extensional; $S_1$-based out-of-plane: thickness-extensional). The $K_t^2$ for the nonlinearly excited waves is seen as increasing with frequency, highlighting the potential for nonlinear nano-acoustic devices for realization in low-loss signal processors in mm-wave spectrum.

Matrix 200 in FIG. 2A is adapted to achieve an electrically isolated and spectrally clean frequency reference signals. The exemplary matrix 200 enables acoustic isolation of $f_1$ and $3f_1$ mechanical acoustic signals through properly embedded acoustic-bandgap structures (in part by using the perforated region between the input and the output waveguides) that facilitate energy trapping of the $f_1$ waves, which in turn, result in the nonlinearly generated $3f_1$ harmonics. Matrix 200 is formed from a material like AlN and is shown as including four rectangular waveguide arms that are coupled together through the square shaped coupling plate (i.e., perforated region 215) having a periodic two-dimensional array of cavities. The dimension of and the spacing between the cavities along the column or row direction in the coupling plate are selected so as to form an acoustic bandgap with dispersion characteristic around frequency $f_1$ of nearly 509 MHz (0.509 GHz), which shows as a wide distribution of coefficient data for in-plane $S_0$ wave at the beginning of the frequency range.

Figure 3:
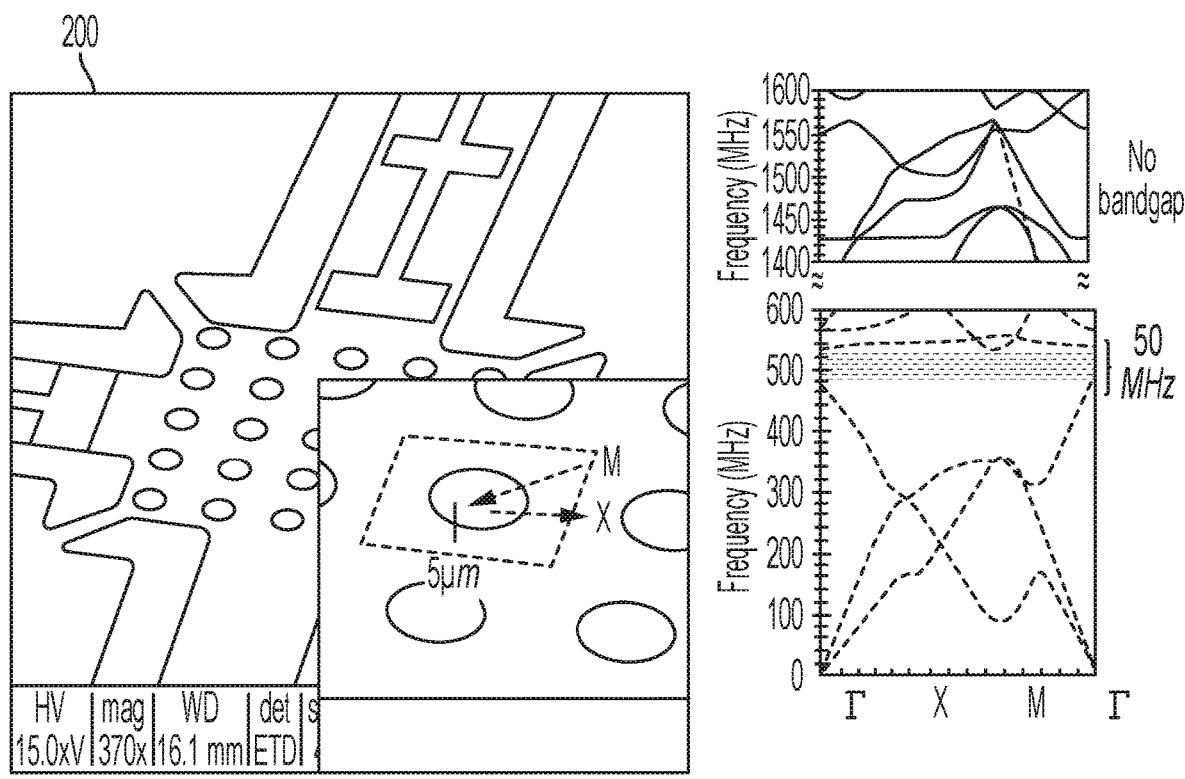
FIG. 3 shows the dispersion diagram of the coupling plate around input frequency and its third harmonic.

FIG. 3 shows the dispersion diagram of the coupling plate around $f_1$ and $3f_1$ at right, for the transducer 200 at left, which has an enlarged area for one cavity, shown in the middle of FIG. 3. While a wide bandgap of nearly 50 MHz is seen in the dispersion diagram at right (a grey frequency band in the diagram) to exist at frequency $f_1$ around 509 MHz, as a lower frequency shown in the lower range of the dispersion diagram, several solutions are seen as being present around the $3f_1$. in the higher frequency range of dispersion diagram. Therefore, while the perforated coupling plate blocks the energy leakage at $f_1$, it is transparent to the harmonics $3f_1$. Therefore, matrix 200 enables energy trapping of the in-plane $S_0$ Lamb waves excited at $f_1$ through properly placed electrodes on the input waveguides, with a large quality-factor (Q).

Figure 4A:
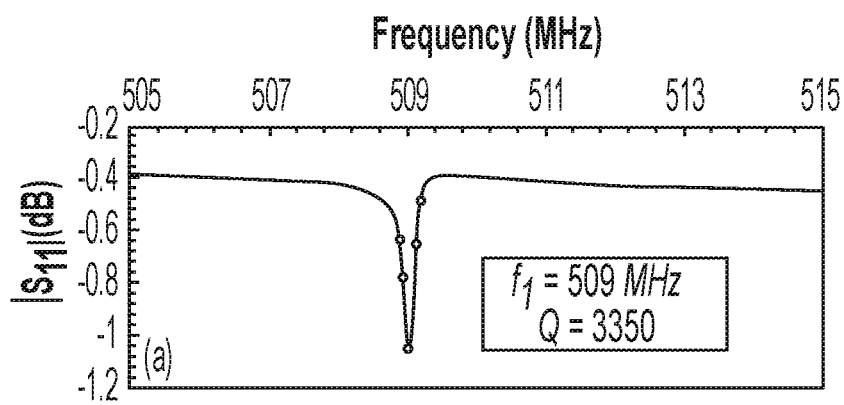
FIG. 4A shows the frequency response of the transducer matrix.
Figure 4B:
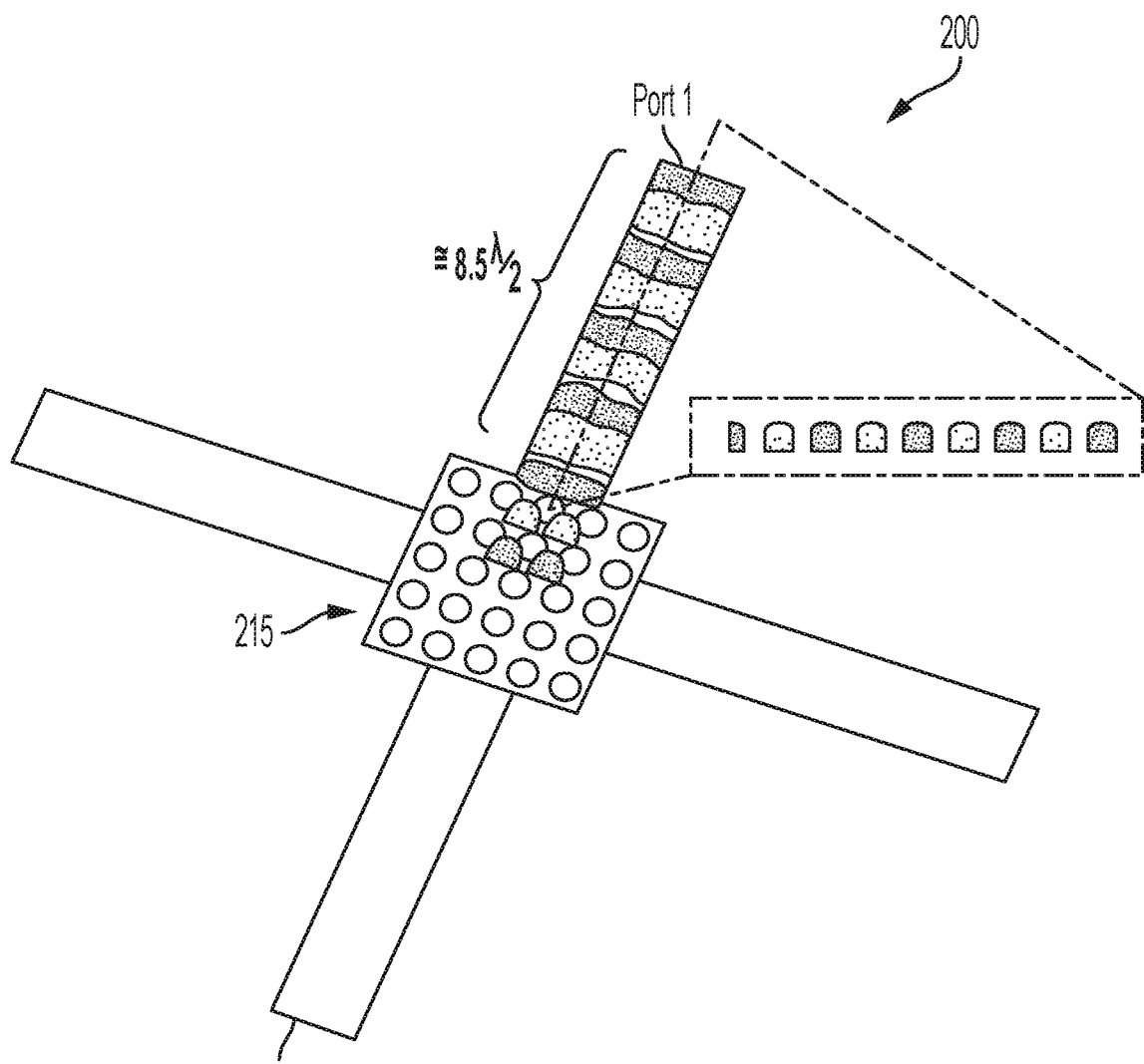
FIG. 4B shows the standing waves formed in the input waveguide arm, according to an embodiment of the disclosure.

FIG. 4A shows the frequency response of matrix 200 measured through the reflection at port 1 (i.e. $S_{11}$). A high-Q of 3350 is extracted from $S_{11}$ at 509 MHz in response to the effective energy trapping of the $S_0$ Lamb wave through the coupling plate, as demonstrated by the simulated vibration mode-shape in the FIG. 4B. FIG. 4B also shows the standing waves formed in the input waveguide arm when the input waveguide arm is nearly 8.5 times as long as the half wavelength of the excitation signal $f_1$. With the increase in the amplitude of the electrical excitation at frequency $f_1$ at port 1, nonlinearly generated harmonics, e.g., $3f_1$ are excited and spread through the coupling plate 215 into the entire matrix 200. The $3f_1$ harmonics are filtered and amplified to achieve a relatively high-Q resonance mode at 1529 MHz (i.e., nearly $3f_1$) by proper selection of the matrix geometry, such as, for example, the number of cavities, the size and depth of each cavity, the spacing between the cavities, the material used to form the matrix, and the like.

Figure 5A:
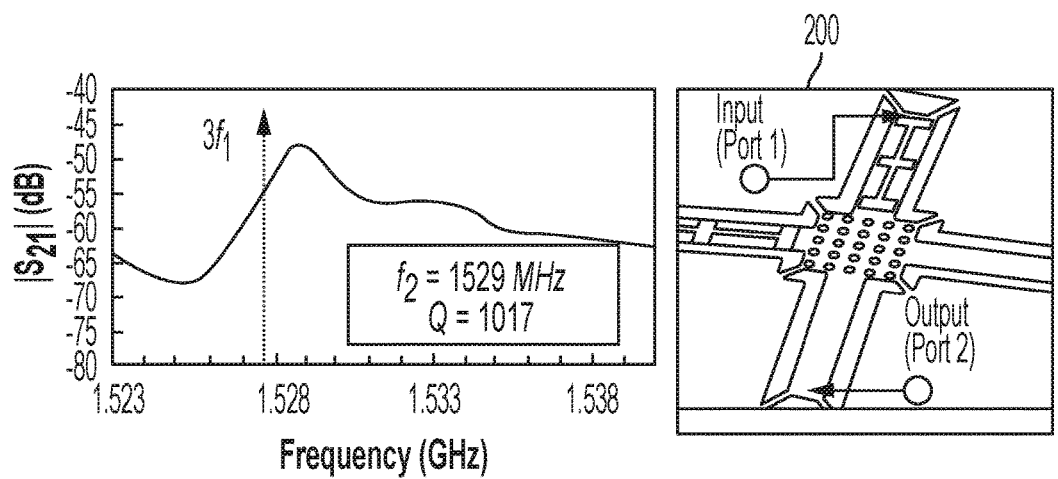
FIG. 5A shows the frequency response of the transducer matrix in FIGS. 2A and 4B measured through the transmission between input and output ports.
Figure 5B:
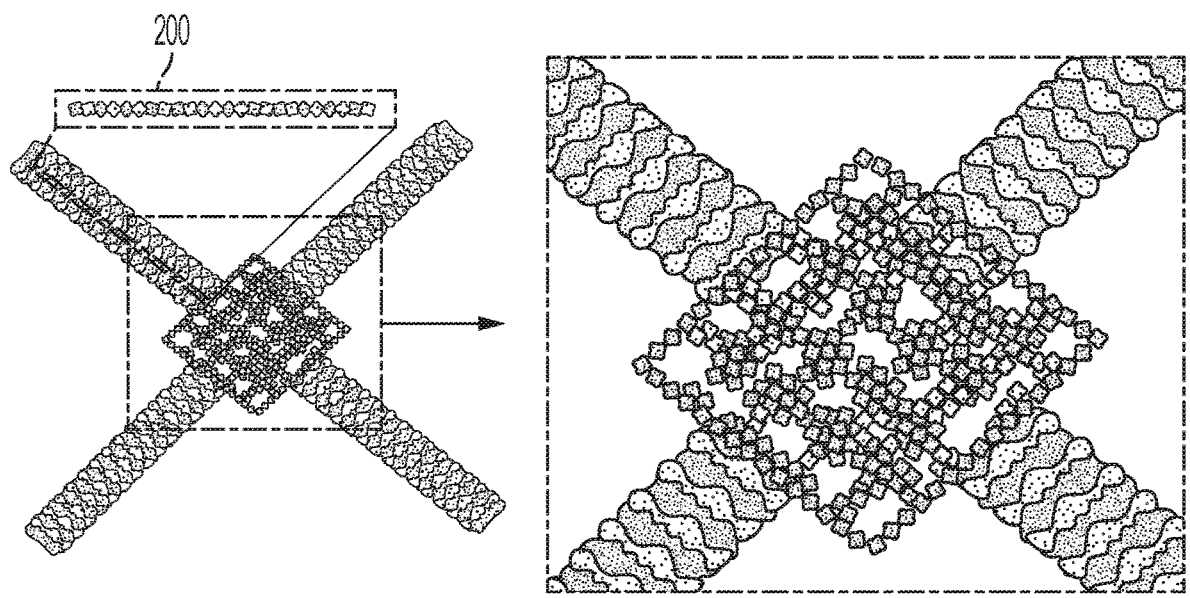
FIG. 5B shows the vibration mode-shape of the transducer matrix at the third harmonic of the input frequency.

FIG. 5A shows the frequency response of matrix 200 (also shown in FIGS. 2A and 4B) measured through the transmission between ports 1 and 2 (i.e. $S_{21}$). The frequency response is shown in the left graph, and the matrix 200's image is shown at the right. A relatively high Q of 1017 is measured for the bulk acoustic resonance mode at 1529 MHz (nearly $3f_1$). FIG. 5B shows the vibration mode-shape of the matrix 200 at 1529 MHz displaying the uniform distribution of the vibration amplitude over the entire waveguides of the matrix.

To verify the operation of the matrix for phase-synchronous generation of $f_1$ and $3f_1$ references, an open-loop harmonic voltage is applied at $f_1$ to the port 1 of the matrix 200, while the frequency response is measured around $f_1$ and $3f_1$ at port 2. A N5193A signal generator (commercially available from Keysight) is used with a 50 dB harmonic suppression in the operation range of the matrix device. To ensure the suppression of potential electronically generated harmonics, a N0415301 (commercially available from Microwave Circuits) notch filter is embedded at the signal generator output, which provides additional 40 dB rejection over 1500-1560 MHz. Such a setup enables accurate detection of the nonlinearly excited harmonic, due to the elastic anharmonicity, at port 2 of the matrix without the misleading or destructive effect of any electronically generated harmonic by the signal generator. The measurements are carried out at a stable temperature of 30±0.2° C. to reduce external temperature variations on device operation.

FIG. 6A shows an experimental set up for characterization of matrix 200 that achieves phase-synchronous, electrically isolated, and spectrally clean frequency reference $f_1$ and $3f_1$ frequency harmonics signals. Open-loop excitation of the matrix 200 in port 1 ($P_{in}$) at 509 MHz provides excitation of the $3f_1$ waves through nonlinear wave-mixing that are amplified through the high-Q resonance mode at 1529 MHz and measured at output port 2 ($P_{out}$). As is seen from FIG. 6B1 and FIG. 6B2, a relatively strong signal is measured at $3f_1$, which is 12 dB larger compared to the linear content at $f_1$, denoting the generation of a spectrally clean third-order harmonic at port 2 that is nonlinearly coupled to the reference $f_1$ signal at port 1. The 12 dB $3f_1$-$f_1$ margin may be further improved by, for example, increasing the dimensions of the acoustic bandgap structure to enhance the suppression of the $f_1$ wave leakage, and by Q-enhancement and realization of a tuning mechanism for the $f_2$ resonance mode of the matrix. The matrix may be further adapted to amplify, for example 3" $f_1$ harmonics, or any other integer, non-integer, or fraction of the frequency of the excitation signal $f_1$ so as to cover the full UHF (Ultra High Frequency band) and SHF (Super High Frequency band) spectrum.

The above embodiments of the present invention are illustrative and not limitative. Other additions, subtractions or modifications are obvious in view of the present disclosure and are intended to fall within the scope of the appended claims.

The invention claimed is:

1. A frequency synthesizer comprising:
a waveguide comprising at least a first arm for receiving an input electric signal and a second arm for supplying an output signal; and
a perforated region comprising a plurality of cavities disposed between the first and second arms.

2. The frequency synthesizer of claim 1, wherein the plurality of cavities forms a two dimensional array of cavities.

3. The frequency synthesizer of claim 2, wherein a frequency of the output signal is defined by a number of the plurality of cavities.

4. The frequency synthesizer of claim 3, wherein the frequency of the output signal is further defined by a width of each of the plurality of cavities.

5. The frequency synthesizer of claim 4, wherein the frequency of the output signal is further defined by a spacing between each pair of adjacent cavities.

6. The frequency synthesizer of claim 5, wherein the waveguide further comprises a third arm and a fourth arm coupled to the first and second arms by the perforated region, wherein the first, second, third, and fourth arms form a cross-coupled rectangular waveguide.

7. The frequency synthesizer of claim 1, wherein the frequency synthesizer is formed in a semiconductor substrate.

8. The frequency synthesizer of claim 7, wherein the frequency synthesizer is formed from a piezoelectric material like aluminum nitride (AlN) disposed on the semiconductor substrate.

9. The frequency synthesizer of claim 7, wherein the frequency of the output signal is further defined by a doping profile of impurities implanted in the semiconductor substrate.

10. The frequency synthesizer of claim 7, wherein the frequency of the output signal is further defined by a crystal orientation of the semiconductor substrate.

11. The frequency synthesizer of claim 7, wherein the semiconductor substrate is silicon substrate.

12. A frequency synthesizer comprising:
a waveguide comprising a first arm for receiving an input electric signal at a first frequency and a second arm for supplying an output signal; and
a perforated region comprising a plurality of cavities disposed between the first and second arms;
wherein the first arm comprises a plurality of metal fingers, disposed perpendicular to the first arm and spaced apart from one another by a wavelength of the input electric signal to ensure acoustic excitation in the first arm at the first frequency; and
wherein the second arm comprises a single finger to accommodate a non-linear output signal having a frequency at a harmonic of the first frequency.

13. The frequency synthesizer of claim 12, wherein the output signal further comprises a linear output signal at the first frequency, wherein the linear output signal is characterized as degrading with higher frequencies and the non-linear output signal is characterized as increasing in intensity with higher frequencies.

14. The frequency synthesizer of claim 12, wherein the non-linear output signal resonates at a third harmonic of the first frequency.

15. The frequency synthesizer of claim 12, wherein the perforated region comprises a two dimensional array of cavities for filtering acoustic waves of the first frequency.

16. The frequency synthesizer of claim 12, wherein the frequency synthesizer is formed from a piezoelectric material like-aluminum nitride (AlN) on a semiconductor substrate.

17. The frequency synthesizer of claim 12, further comprising a trans-impedance amplifier (TIA) circuitry to enable close-loop excitation of acoustic waves at the first arm.

18. The frequency synthesizer of claim 12, wherein the waveguide further comprises a third and a fourth arms coupled to the first and second arms by the perforated region, wherein the first, second, third, and fourth arms form a cross-coupled rectangular waveguide.

19. The frequency synthesizer of claim 12, wherein a frequency of the output signal is defined by a number of the plurality of cavities.

20. The frequency synthesizer of claim 19, wherein the frequency of the output signal is further defined by a width of each of the plurality of cavities and a spacing between each pair of adjacent cavities along a row and a column.

* * * * *